US008686558B2

(12) United States Patent
Zhao et al.

(10) Patent No.: US 8,686,558 B2
(45) Date of Patent: Apr. 1, 2014

(54) THERMALLY AND ELECTRICALLY ENHANCED BALL GRID ARRAY PACKAGE

(75) Inventors: Sam Ziqun Zhao, Irvine, CA (US); Reza-ur Rahman Khan, Rancho Santa Margarita, CA (US); Edward Law, Tracy, CA (US); Marc Papageorge, Pleasanton, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/224,933

(22) Filed: Sep. 2, 2011

(65) Prior Publication Data

US 2011/0318885 A1 Dec. 29, 2011

Related U.S. Application Data

(62) Division of application No. 12/619,385, filed on Nov. 16, 2009, now Pat. No. 8,039,949, which is a division of application No. 10/963,620, filed on Oct. 14, 2004, now Pat. No. 7,629,681, which is a division of application No. 09/997,272, filed on Nov. 30, 2001, now Pat. No. 6,882,042.

(60) Provisional application No. 60/250,950, filed on Dec. 1, 2000.

(51) Int. Cl.
*H01L 23/10* (2006.01)
*H01L 23/34* (2006.01)

(52) U.S. Cl.
USPC 257/712; 257/706; 257/E23.08; 257/E23.087

(58) Field of Classification Search
USPC .................................................. 257/706, 712
See application file for complete search history.

(56) References Cited

U.S. PATENT DOCUMENTS

| 3,790,866 A | 2/1974 | Meyer et al. |
| 4,611,238 A | 9/1986 | Lewis et al. |
| 5,045,921 A | 9/1991 | Lin et al. |
| 5,065,281 A | 11/1991 | Hernandez et al. |
| 5,173,766 A | 12/1992 | Long et al. |

(Continued)

FOREIGN PATENT DOCUMENTS

| EP | 0 573 297 A2 | 12/1993 |
| EP | 0 504 411 B1 | 6/1998 |

(Continued)

OTHER PUBLICATIONS

Ahn, S.H. and Kwon, Y.S., "Popcorn Phenomena in a Ball Grid Array Package", *IEEE Transactions on Components, Packaging, and Manufacturing Technology Part B: Advanced Packaging*, Aug. 1995, vol. 18, No. 3, pp. 491-495.

(Continued)

*Primary Examiner* — David Zarneke
(74) *Attorney, Agent, or Firm* — Sterne, Kessler, Goldstein & Fox P.L.L.C.

(57) ABSTRACT

In one embodiment, a method for assembling a ball grid array (BGA) package is provided. The method includes providing a stiffener that has opposing first and second surfaces, wherein the first surface is capable of mounting an integrated circuit (IC) die in a central area and forming a pattern in at least a portion of the first surface to enhance the adhesiveness of an encapsulant material to the first surface.

20 Claims, 18 Drawing Sheets

(56) References Cited

U.S. PATENT DOCUMENTS

| | | | |
|---|---|---|---|
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |
| 5,583,377 A * | 12/1996 | Higgins, III ............ 257/707 |
| 5,583,378 A | 12/1996 | Marrs et al. |
| 5,640,047 A | 6/1997 | Nakashima |
| 5,642,261 A | 6/1997 | Bond et al. |
| 5,648,679 A | 7/1997 | Chillara et al. |
| 5,650,659 A | 7/1997 | Mostafazadeh et al. |
| 5,650,662 A | 7/1997 | Edwards et al. |
| 5,691,567 A | 11/1997 | Lo et al. |
| 5,717,252 A | 2/1998 | Nakashima et al. |
| 5,736,785 A | 4/1998 | Chiang et al. |
| 5,741,729 A | 4/1998 | Selna |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,020,637 A | 2/2000 | Karnezos |
| 6,022,759 A | 2/2000 | Seki et al. |
| 6,028,358 A | 2/2000 | Suzuki |
| 6,034,427 A | 3/2000 | Lan et al. |
| 6,040,984 A | 3/2000 | Hirakawa |
| 6,057,601 A | 5/2000 | Lau et al. |
| 6,060,777 A * | 5/2000 | Jamieson et al. ............ 257/707 |
| 6,064,111 A | 5/2000 | Sota et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,278,613 B1 | 8/2001 | Fernandez et al. |
| 6,282,094 B1 | 8/2001 | Lo et al. |
| 6,288,444 B1 | 9/2001 | Abe et al. |
| 6,313,521 B1 | 11/2001 | Baba |
| 6,313,525 B1 | 11/2001 | Sasano |
| 6,347,037 B2 | 2/2002 | Iijima et al. |
| 6,359,341 B1 | 3/2002 | Huang et al. |
| 6,362,525 B1 | 3/2002 | Rahim |
| 6,365,980 B1 | 4/2002 | Carter, Jr. et al. |
| 6,369,455 B1 | 4/2002 | Ho et al. |
| 6,380,623 B1 | 4/2002 | Demore |
| 6,396,141 B2 | 5/2002 | Schueller et al. |
| 6,462,274 B1 | 10/2002 | Shim et al. |
| 6,472,741 B1 | 10/2002 | Chen et al. |
| 6,515,361 B2 | 2/2003 | Lee et al. |
| 6,525,942 B2 | 2/2003 | Huang et al. |
| 6,528,869 B1 | 3/2003 | Glenn et al. |
| 6,528,892 B2 | 3/2003 | Caletka et al. |
| 6,537,848 B2 | 3/2003 | Camenforte et al. |
| 6,541,832 B2 | 4/2003 | Coyle |
| 6,545,351 B1 * | 4/2003 | Jamieson et al. ............ 257/712 |
| 6,551,918 B2 | 4/2003 | Yuzawa et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,558,966 B2 | 5/2003 | Mess et al. |
| 6,559,525 B2 | 5/2003 | Huang |
| 6,563,712 B2 | 5/2003 | Akram et al. |
| 6,583,516 B2 | 6/2003 | Hashimoto |
| 6,602,732 B2 | 8/2003 | Chen |
| 6,614,660 B1 | 9/2003 | Bai et al. |
| 6,617,193 B1 | 9/2003 | Toshio et al. |
| 6,624,523 B2 | 9/2003 | Chao et al. |
| 6,657,870 B1 | 12/2003 | Ali et al. |
| 6,664,617 B2 | 12/2003 | Siu |
| 6,724,071 B2 | 4/2004 | Combs |
| 6,724,080 B1 | 4/2004 | Ooi et al. |
| 6,853,070 B2 | 2/2005 | Khan et al. |
| 6,879,039 B2 | 4/2005 | Khan et al. |
| 6,882,042 B2 | 4/2005 | Zhao et al. |
| 6,887,741 B2 | 5/2005 | Zhao et al. |
| 6,913,468 B2 | 7/2005 | Dozier, II et al. |
| 7,061,102 B2 | 6/2006 | Eghan et al. |
| 7,132,744 B2 | 11/2006 | Zhao et al. |
| 7,156,161 B2 | 1/2007 | Thoman et al. |
| 7,259,448 B2 | 8/2007 | Zhang et al. |
| 7,629,681 B2 | 12/2009 | Zhao et al. |
| 2002/0079572 A1 | 6/2002 | Khan et al. |
| 2002/0096767 A1 | 7/2002 | Cote et al. |
| 2002/0190361 A1 | 12/2002 | Zhao et al. |
| 2005/0077545 A1 | 4/2005 | Zhao et al. |

FOREIGN PATENT DOCUMENTS

| | | |
|---|---|---|
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |

(56) References Cited

FOREIGN PATENT DOCUMENTS

| | | | |
|---|---|---|---|
| JP | 11-102989 A | 4/1999 | |
| JP | 2000-286294 A | 10/2000 | |
| JP | 2001-68512 A | 3/2001 | |
| TW | 383908 | 3/2000 | |
| TW | 417219 | 1/2001 | |

OTHER PUBLICATIONS

Amkor Electronics, "Amkor BGA Packaging: Taking the World by Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology,"*Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30, and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com English-language Translation of JP 10-247702, published Sep. 14, 1998, 8 pages.

English-lanuage Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International, Proceedings of the Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

(56) References Cited

OTHER PUBLICATIONS

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes on QFPs", *Advanced Packaging*, IHS Publishing Group, Winter 1993, vol. 2, No. 1, pp. 38-39.

Houghten, J.L., "Plastic Ball-Grid Arrays Continue to Evolve", *Electronic Design*, Feb. 6, 1995, pp. 141-146.

"How to Give Your BGAs a Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Kawahara, T. et al., "Ball Grid Array Type Package by Using of New Encapsulation Method", *Proceedings of the 1995 International Electronics Packaging Conference*, San Diego, CA, Sep. 24-27, 1995, pp. 577-587.

Knickerbocker, J.U. and Cole M.S.,"Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI Logic Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New SuperBGA® Package", *1995 International Electronics Packaging Conference*, San Diego, California, Sep. 24-27, 1995, pp. 565-576.

Marrs, R.C. and Olachea, G., "BGAs for MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, J. and Viswanadham, P., "Organic Carrier Requirements for Flip Chip Assemblies", *Journal of Surface Mount Technology*, Surface Mount Technology Association, Jul. 1994, pp. 15-20.

Ramirez, C. and Fauser, S., "Fatigue Life Comparison of the Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection of Flip Chip Attach Using Digital Tomosynthesis", *Surface Mount International Proceedings of the Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Sakaguchi, H., "BGA Mounting Technology," pp. 1-4, date and source unknown.

Schmolze, C. and Fraser, A., "Spice Modeling Helps Enhance BGA Performance", *Electronic Packaging & Production*, Jan. 1995, pp. 50-52.

Schueller, R.D. et al., "Performance and Reliability of a Cavity Down Tape BGA Package," *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

(56) References Cited

OTHER PUBLICATIONS

Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorial and Short Courses", *45th Electronic Components & Technology Conference*, May 21-24, 1995, Las Vegas, Nevada, IEEE, 4 pages.

Vardaman, E. J. and Crowley, R.T., "Worldwide Trends in Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Production (Special Supplement)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, an IHS Group Publication, May/Jun. 1995, pp. 44-46.

English-language Abstract of FR 2803098, published Jun. 29, 2001, 1 page, printed from http://v3.espacenet.com.

English-language Summary of Decision of Rejection from Taiwanese Application No. 91108573, 5 pages.

Zhao et al., U.S. Appl. No. 10/284,340, filed Oct. 31, 2002, entitled "Ball Grid Array Package With Patterned Stiffener Layer," 137 pages.

Amkor package data sheet, "SuperFC®", from http://www.amkor.com/Products/all_datasheets/superfc.pdf, 2 pages (Jan. 2003).

Andros, F., "Tape Ball Grid Array," from Puttlitz, K.J. and Totta, P.A. (eds.), *Array Interconnection Handbook*, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging and Interconnection Handbook*, Third Edition, pp. 7.58-7.59, ISBN No. 0-07-134745-3, McGraw-Hill Companies (2000).

Lin, S. and Chang, N., "Challenges in Power-Ground Integrity," *Proceedings of the 2001 International Conference on Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions on Very Large Scale Integration (VLSI) Systems*, vol. 10, No. 4, pp. 487-493 (Aug. 2002).

\* cited by examiner

US 8,686,558 B2

THERMALLY AND ELECTRICALLY ENHANCED BALL GRID ARRAY PACKAGE

CROSS REFERENCE TO RELATED APPLICATIONS

This application is a divisional of U.S. application Ser. No. 12/619,385, filed Nov. 16, 2009 (now U.S. Pat. No. 8,039, 949), which is a divisional of U.S. application Ser. No. 10/963,620, filed Oct. 14, 2004 (now U.S. Pat. No. 7,629, 681), which is a divisional of U.S. application Ser. No. 09/997,272, filed Nov. 30, 2001 (now U.S. Pat. No. 6,882, 042), which claims the benefit of U.S. Provisional Application No. 60/250,950, filed Dec. 1, 2000, all of which are incorporated by reference herein.

BACKGROUND

1. Field

The invention relates generally to the field of integrated circuit (IC) device packaging technology, and more particularly to substrate stiffening and heat spreading techniques in ball grid array (BGA) packages.

2. Background Art

Integrated circuit (IC) dies are typically mounted in or on a package that is attached to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. The IC die is mounted to a top surface of the package substrate. Wire bonds typically couple signals in the IC die to the substrate. The substrate has internal routing which electrically couples the IC die signals to the solder balls on the bottom substrate surface.

It would be advantageous to provide a thermally and electrically enhanced ball grid array (BGA) package that is smaller, cheaper, customizable and capable of superior performance when compared with conventional BGA packages. More specifically, it would be advantageous to provide an advanced BGA package that achieves: 1) enhanced thermal and electrical performance; 2) reduced package size; 3) increased flexibility of die configuration; 4) reduced ball pitch; 5) increased flexibility in circuit routing density; and 6) configurations with greater thermal spreading capabilities.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
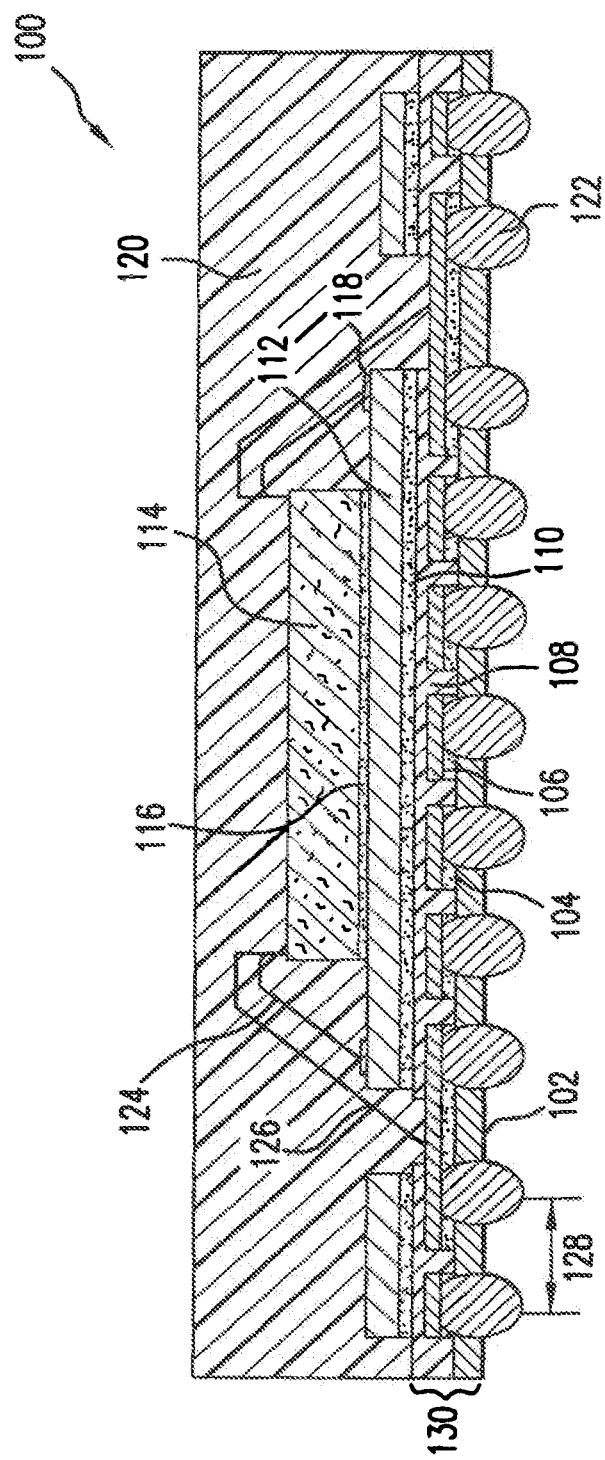
FIG. 1 is a cross-sectional representation of a BGA package design in accordance with one embodiment of the disclosed method and apparatus.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

The present invention provides a thermally and electrically enhanced ball grid array (BGA) packaging that is smaller, cheaper, customizable and capable of superior performance when compared with conventional BGA packages. More specifically, the present invention offers advanced BGA packages that achieve: 1) enhanced thermal and electrical performance; 2) reduced package size; 3) increased flexibility of die configuration; 4) reduced ball pitch; 5) increased flexibility in circuit routing density; and 6) optional configurations with or without the attachment of a heat sink.

Embodiments of the present invention may be used in a variety of electronic devices, including telecommunication devices, mobile phones, camcorders, digital cameras, network systems, printers, and testers.

Advantages of the various embodiments of the invention include: 1) an embedded heat spreader in the package for the silicon die to adhere onto, and a connection between the die and the heat spreader to provide thermal and electrical performance enhancement; 2) an option of a fully populated ball grid array assignment for circuit routing; 3) an option of multi-layer heat spreader structure to provide split and isolated ground; 4) an option of utilizing single, double or multi-layer metal circuitry substrate with or without plating traces and with or without conductive via connections to accommodate different thermal, electrical and design requirements; 5) exposed die attach pad for enhanced thermal performance; 6) drop-in heat slug for direct thermal and electrical conduction; 7) flexible range of ball pitch from 0.3 mm to 1.5 mm; 8) active ground connection capability from silicon die to motherboard through conductive slug attachment or through solder ball connects to the heat spreader; 9) high thermal conductive path; 10) low package profile compared with plastic ball grid array (PBGA) and other conventional BGA packages; and 11) wafer saw or punch format for maximized material utilization.

Embodiments of the present invention are described in detail below, and are designated as Designs 1 through 18.

Design 1—Fully Populated Package with Solid Grounding

FIG. 1 shows a BGA package 100, according to an embodiment of the present invention. BGA package 100 incorporates a substrate 130 with a single metal layer, and a heat spreader/stiffener 112 with selective plating. BGA package 100 includes substrate 130, stiffener 112, an integrated circuit die 114, a mold/glob top 120, a plurality of solder balls 122, a first wire connection 124, and a second wire connection 126.

Substrate 130 includes a base material/dielectric layer 102, a conductive metal layer 106, and a circuit mask 108. Metal layer 106 is attached to the bottom surface of dielectric layer 102 by an adhesive 104. Metal layer 106 is a conductive layer that is patterned with traces. Circuit mask 108 is applied to the top surface of dielectric layer 102. Dielectric layer 102 may be any one of PCB, FR4, polyimide, and ceramic dielectric materials.

Stiffener 112 is attached to the top surface of substrate 130 by an adhesive 110. Die 114 is attached to the top surface of stiffener 112 by a die attach epoxy 116. First wire connection 124 is coupled from a pin on die 114 to stiffener 112. A bondable plating surface 118 is formed on the top surface of stiffener 112 to enhance attachment of first wire connection 124 to stiffener 112. Second wire connection 126 is coupled from a pin on die 114 to a trace of metal layer 106. Mold/glob top 120 is formed over the top surface of stiffener 112 to encapsulate die 114 and first and second wire connections 124 and 126.

Preferably, copper is used to make metal layer 106, although other metals may also be used. Similarly, stiffener 112 is preferably made from copper so that it may provide a substantially rigid and planar surface, enhance the coplanarity of the different layers of substrate 130, and, at the same time, act as a heat spreader to help dissipate heat. Alternatively, other materials, such as aluminum or ceramic, may also be used to make the stiffener.

Preferably, bondable surface 118 is selectively plated, chemically deposited or electro-deposited on stiffener 112 for solid or float grounding purposes. Otherwise, stiffener 112 may be fully plated. Dielectric layer 102, preferably a polyimide tape, is patterned with openings or vias for accepting solder balls 122 so that solder balls 122 make electrical contact with the patterned conductive metal layer 106. The distance between centers of adjacent solder balls 122 is shown as ball pitch 128 in FIG. 1.

Table 1 shows example dimensions and ranges for some of the elements shown in FIG. 1:

TABLE 1

| Element | Thickness (mm) |
| --- | --- |
| Base material/dielectric layer 102 | 0.025-2 |
| Adhesive 104 | 0.012-0.25 |
| Trace/Metal layer 106 | 0.012-0.35 |
| Circuit mask 108 | 0.017-0.20 |
| Adhesive 110 | 0.012-0.25 |
| Stiffener 112 | 0.1-1 |
| Thickness of die 114 | 0.15-0.8 |
| Die attach Epoxy 116 | 0.025-0.075 |
| Bondable plating surface 118 | 0.0005-0.05 |
| Mold/Glob top 120 | 0.3-3 |
| Solder ball 122 | 0.15-0.9 (collapsed height) |
| Ball pitch 128 | 0.3-1.5 |

Design 2—Fully Populated Package with Solid Grounding

Figure 2:
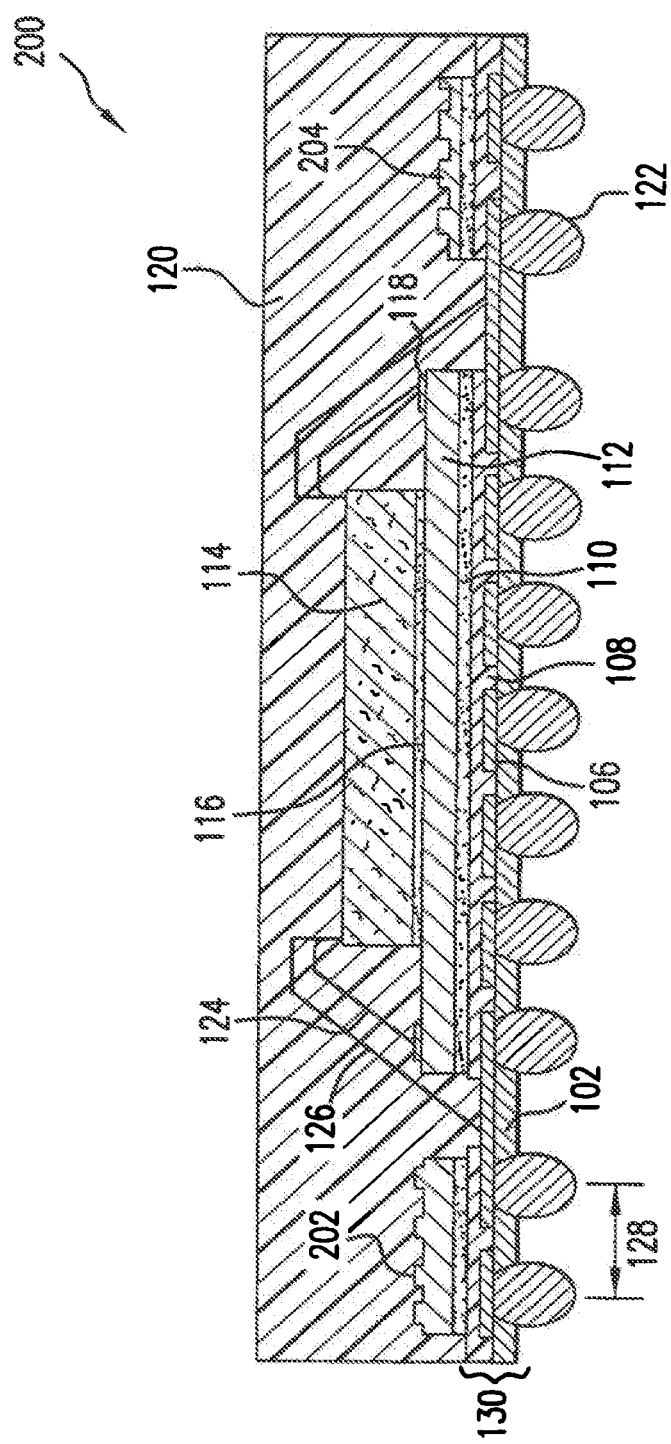
FIG. 2 is a cross-sectional representation of another BGA package design in accordance with one embodiment of the disclosed method and apparatus.

FIG. 2 shows a BGA package 200, according to an embodiment of the present invention. As shown in FIG. 2, BGA package 200 is basically the same as BGA package 100, except that it does not have an adhesive layer 104 between patterned dielectric layer 102 and patterned conductive metal layer 106. Furthermore, a first and second dimple design 202 and 204 are shown on stiffener 112 in FIG. 2. First and/or second dimple designs 202 and 204 on stiffener 112 (e.g., a protrusion or indention) are preferably introduced to enhance the adhesiveness of the molding compound or encapsulant material (i.e., mold/glob top 120) to the surface of stiffener 112 by increasing the total contact surface area. First and second dimple designs 202 and 204 may have any applicable dimensions.

Figure 3:
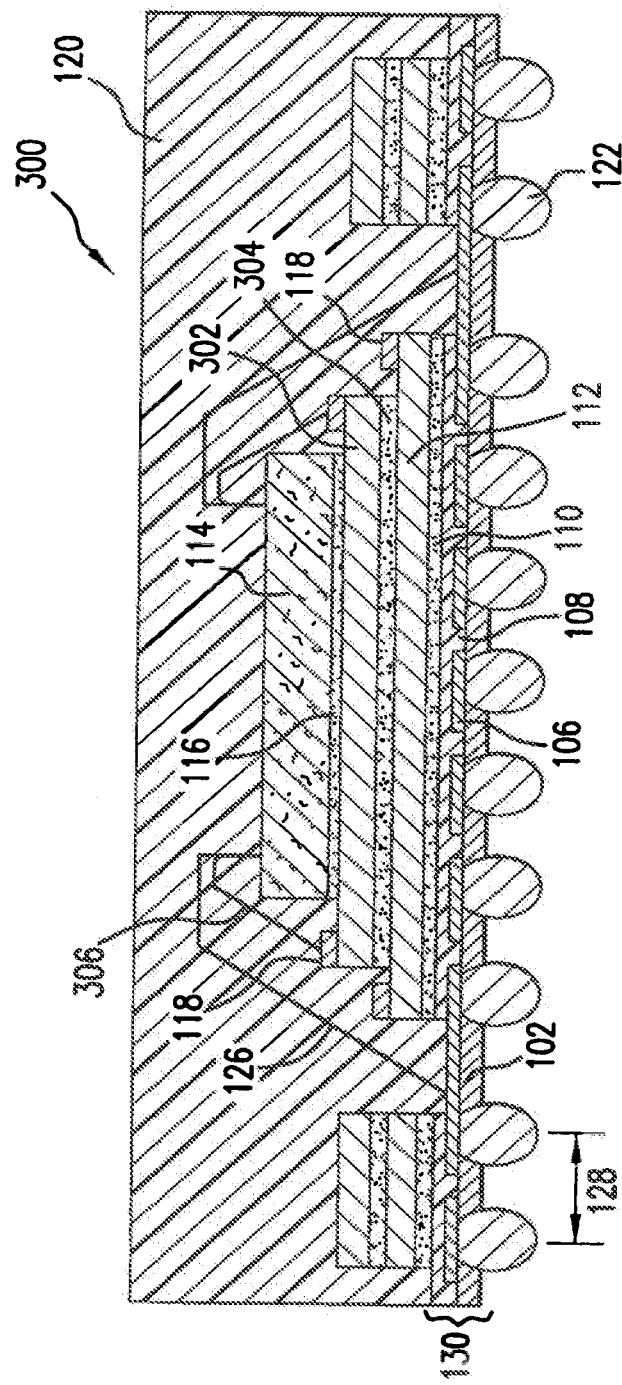
FIG. 3 is a cross-sectional representation of another BGA package design in accordance with one embodiment of the disclosed method and apparatus.

Design 3—Fully Populated Package with Two Stiffeners and Symmetrical Segment Grounding FIG. 3 shows a BGA package 300, according to an embodiment of the present invention. As shown in FIG. 3, BGA package 300 incorporates first stiffener 112 and a second stiffener 302, each with selective plating, to achieve split grounding. In BGA package 300, die 114 is mounted to the top surface of second stiffener 302. A third wire connection 306 is coupled from a pin on die 114 to bondable plating surface 118 on second stiffener 302. In an example embodiment, bondable plating surface 118 on the top stiffener, second stiffener 302, may be used for digital grounding, and bondable plating surface 118 on the bottom stiffener, first stiffener 112, may be used for analog grounding. A dielectric adhesive layer 304 is incorporated between first and second stiffeners 112 and 302 to ensure separated grounding.

Other features of BGA package 300 are similar to the corresponding features in BGA package 200.

Figure 4:
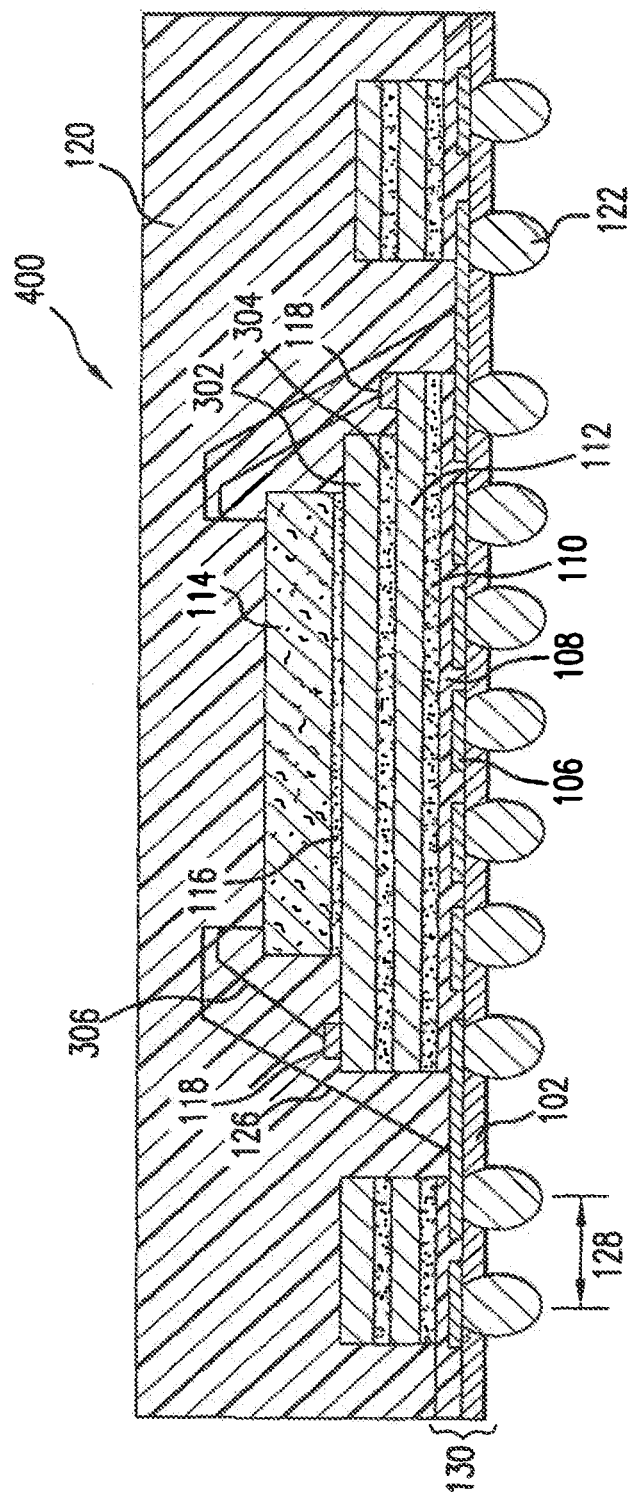
FIG. 4 is a cross-sectional representation of another BGA package design in accordance with one embodiment of the disclosed method and apparatus.

Design 4—Fully Populated Package with Two Stiffeners and Asymmetrical Segment Grounding FIG. 4 shows a BGA package 400, according to an embodiment of the present invention. As shown in FIG. 4, BGA package 400 is similar to BGA package 300 shown in FIG. 3, except that split solid grounding is done asymmetrically. In other words, bondable plating surfaces 118 are placed on the respective first and second stiffeners 112 and 302 asymmetrically.

Other features of BGA package 400 are similar to the corresponding features in aforementioned designs.

Design 5—Fully Populated Package with Enhanced Routability

Figure 5:
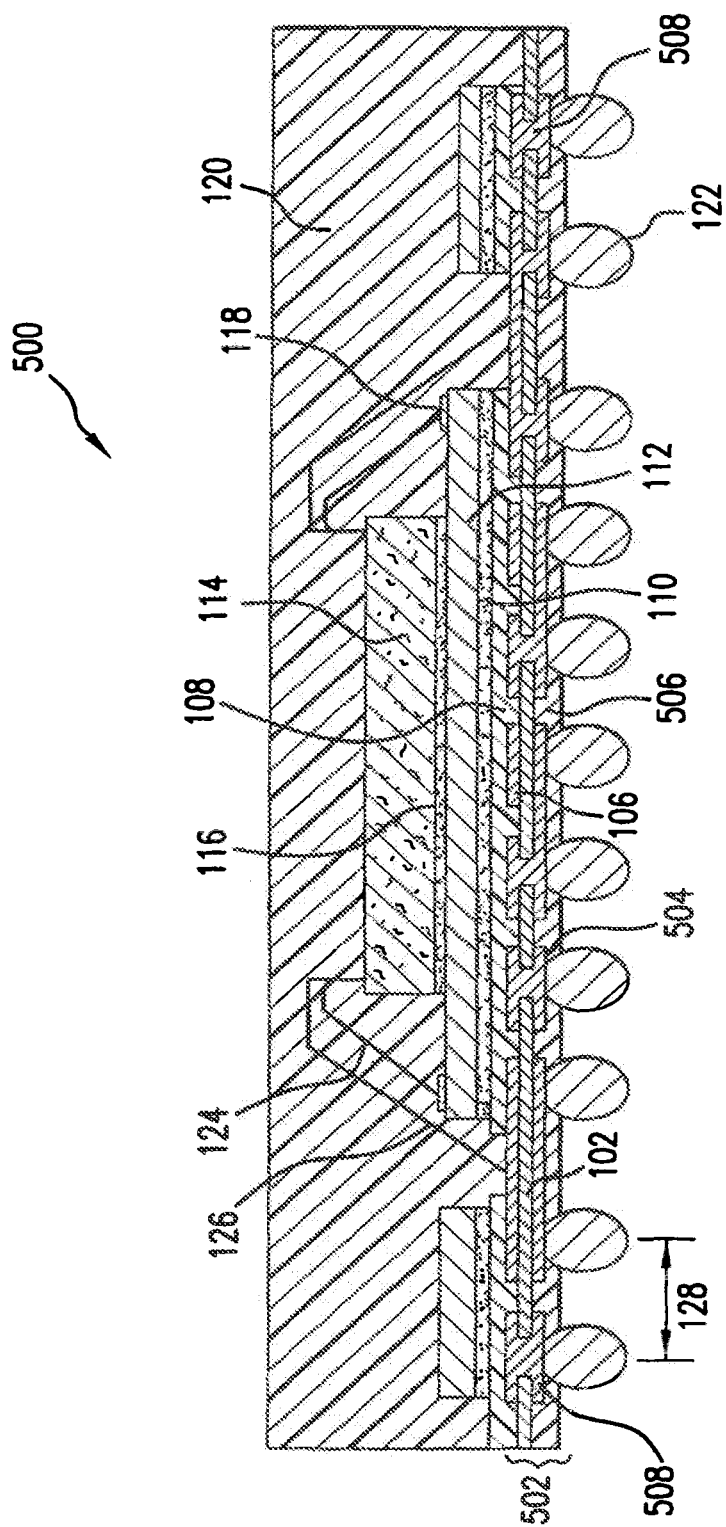
FIG. 5 is a cross-sectional representation of another BGA package design in accordance with one embodiment of the disclosed method and apparatus.

FIG. 5 shows a BGA package 500, according to an embodiment of the present invention. As shown in FIG. 5, a substrate 502 of BGA package 500 incorporates two conductive layers, first metal layer 106 and second metal layer 504, that include traces. First circuit mask 108 is formed over the top surface of substrate 502, and a second circuit mask 506 is formed over the bottom surface of substrate 502. First and second metal layer 106 and 504 are separated by dielectric layer 102, which is preferably a polyimide tape. Dielectric layer 102 includes selective conductive vias 508 between first and second metal layers 106 and 504. By selectively connecting the metal layers through conductive vias 508, enhanced routing flexibility as well as enhanced electrical and thermal performance is provided.

Other features of BGA package 500 are similar to the corresponding features in aforementioned designs.

Design 6—Fully Populated Package with Enhanced Routability

Figure 6:
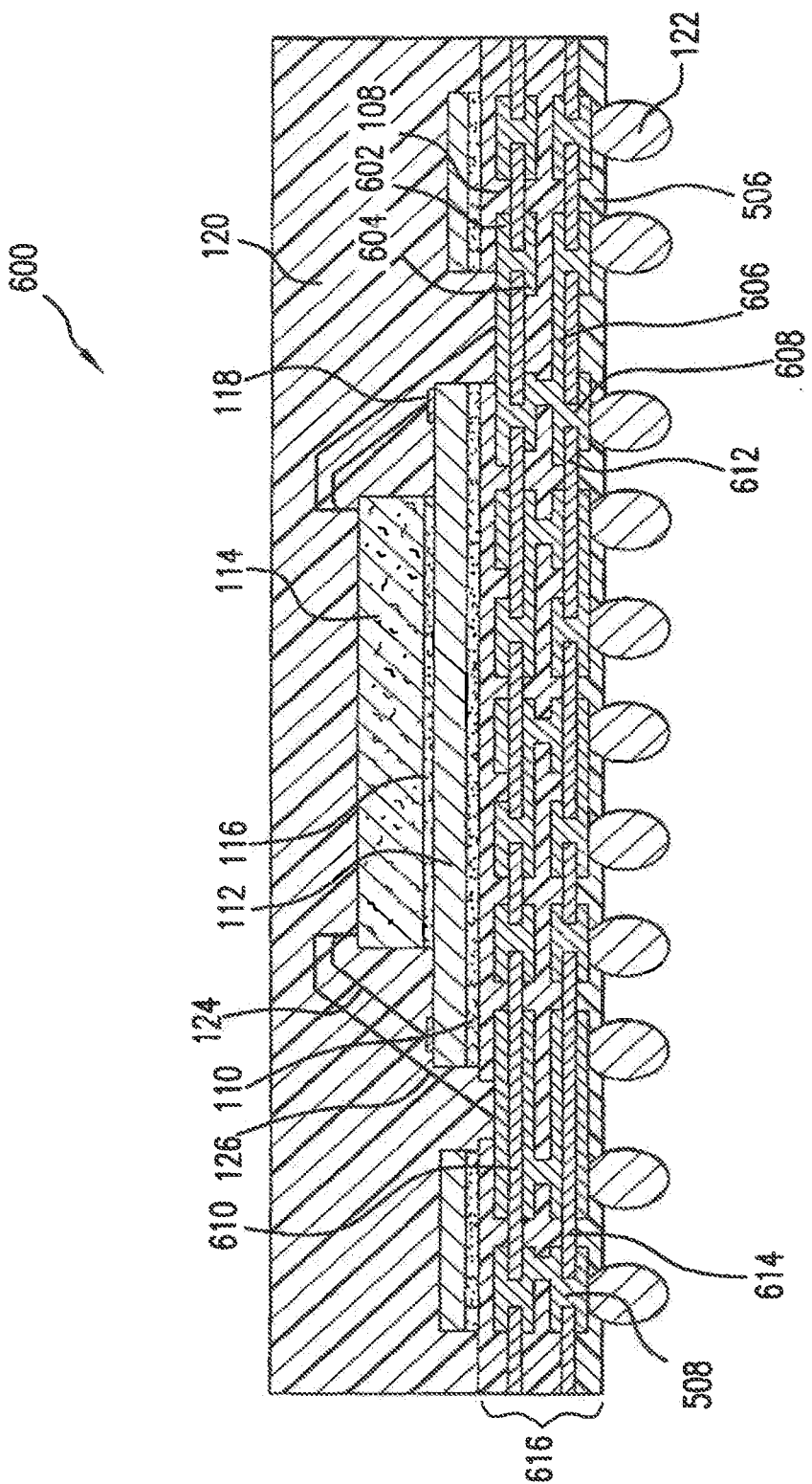
FIG. 6 is a cross-sectional representation of another BGA package design in accordance with one embodiment of the disclosed method and apparatus.

FIG. 6 shows a BGA package 600, according to an embodiment of the present invention. As shown in FIG. 6, BGA package 600 is similar to BGA package 500 shown in FIG. 5 except that BGA package 600 includes a substrate 616 that has four conductive trace layers: a first metal layer 602, a second metal layer 604, a third metal layer 606, and a fourth metal layer 608. The metal layers are separated by dielectric layers with conductive vias. A first dielectric layer 610 separates first metal layer 602 and second metal layer 604. A second dielectric layer 612 separates second metal layer 605 and third metal layer 606. A third dielectric layer 614 separates third metal layer 606 and fourth metal layer 608. For example, second dielectric layer 612 may be a prepeg organic material. Solder balls 122 are attached to portions of fourth metal layer 608 exposed through second circuit mask 506.

As such, BGA package 600 provides superior routing flexibility to BGA package 500, and offers excellent electrical and thermal performance. Note that more conductive layers may be used. In that case, however, both the manufacturing cost and the package size (thickness) would increase accordingly.

Other features of BGA package 600 are similar to the corresponding features in aforementioned designs.

Design 7—Fully Populated Package with Enhanced Signal Integrity

Figure 7:
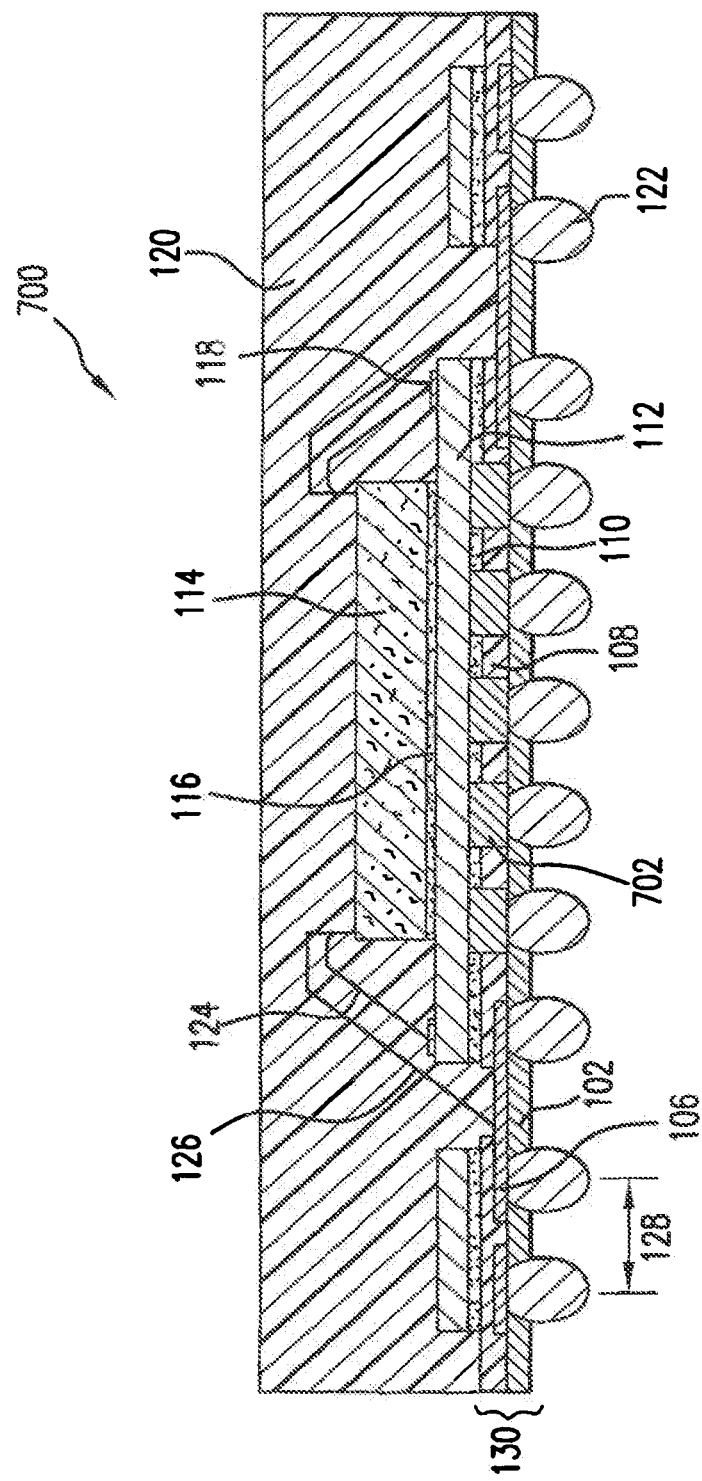
FIG. 7 is a cross-sectional representation of another BGA package design in accordance with one embodiment of the disclosed method and apparatus.

FIG. 7 shows a BGA package 700, according to an embodiment of the present invention. As shown in FIG. 7, BGA package 700 uses conductive paths 702 to connect and ground selected solder balls 122 to stiffener 112. As such, BGA package 700 provides enhanced noise reduction, thus improved signal integrity, by grounding the discharge current through the ground bond (i.e., wire connection 124), stiffener 112, conductive paths 702, and solder balls 122, and discharge to a connecting motherboard (not shown).

Other features of BGA package 700 are similar to the corresponding features in aforementioned designs.

Design 8—Fully Populated Package with Enhanced Signal Integrity and Routability

Figure 8:
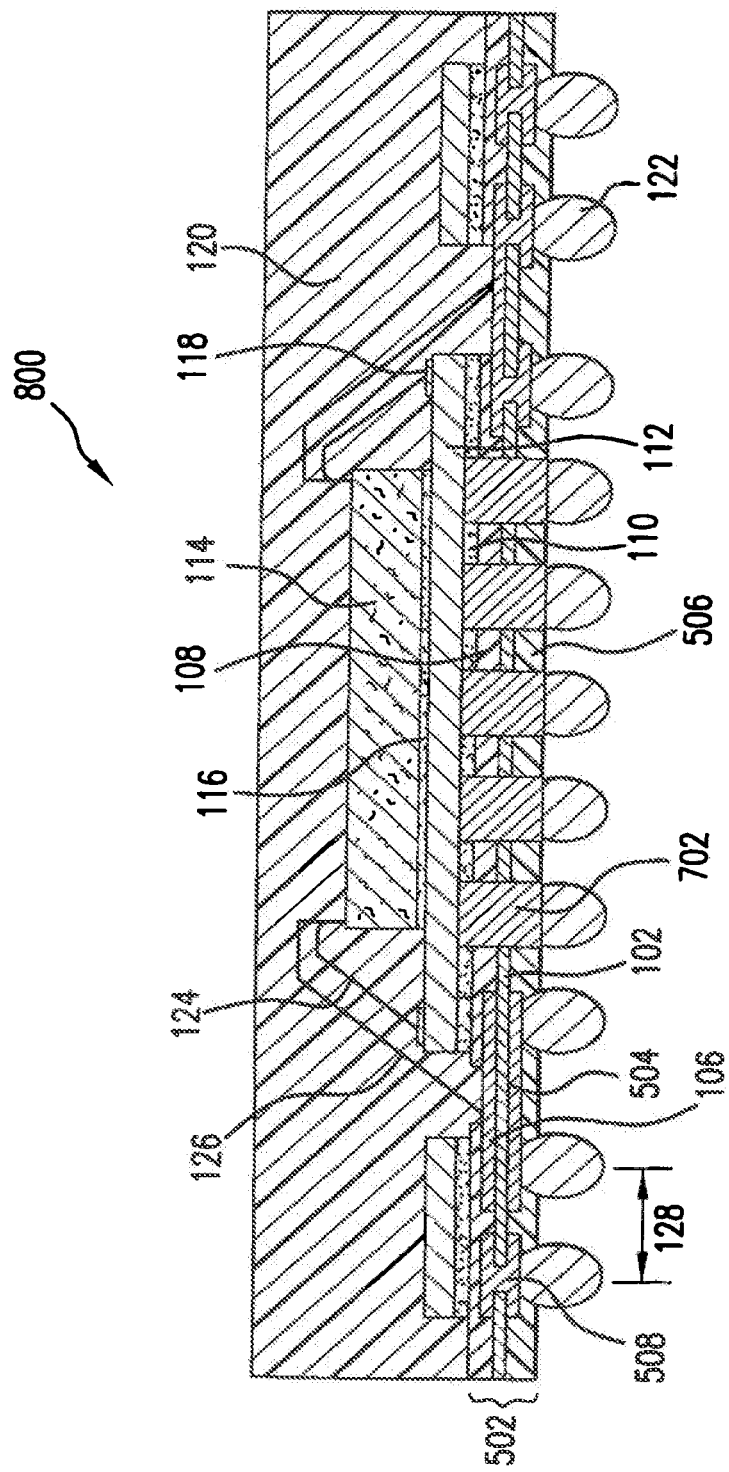
FIG. 8 is a cross-sectional representation of another BGA package design in accordance with one embodiment of the disclosed method and apparatus.

FIG. 8 shows a BGA package 800, according to an embodiment of the present invention. As shown in FIG. 8, BGA package 800 is basically a combination of BGA package 500 shown in FIG. 5 and BGA package 700 shown in FIG. 7, providing enhanced routing flexibility and signal integrity. In other words, BGA package 800 is BGA package 700 with two conductive layers, first and second metal layers 106 and 504, instead of a single metal layer.

Other features of BGA package 800 are similar to the corresponding features in aforementioned designs.

Design 9—Partially Depopulated Package with Partially Exposed Stiffener

Figure 9:
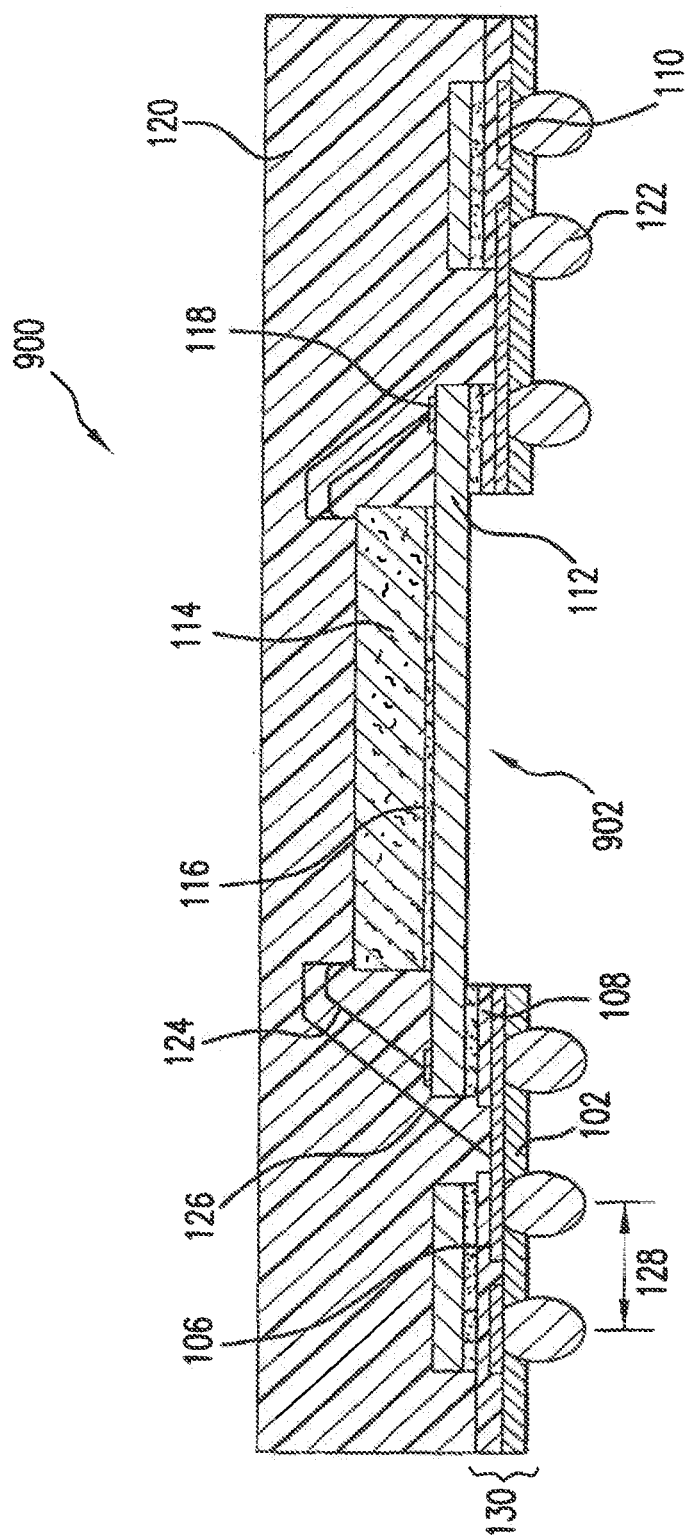
FIG. 9 is a cross-sectional representation of another BOA package design in accordance with one embodiment of the disclosed method and apparatus.

FIG. 9 shows a BGA package 900, according to an embodiment of the present invention. As shown in FIG. 9, substrate 130 of BGA package 900 has a "punched" opening or window that exposes a part of stiffener 112, shown as exposed stiffener portion 902. BGA package 900 improves thermal performance because heat may be readily dissipated via exposed stiffener portion 902 of stiffener 112. In addition, plating trace routability is also enhanced through the debussing window punched opening. It should be readily apparent to those of ordinary skill in the art that the size of the opening may vary depending on, for example, the desired size of an optional heat slug to be attached to stiffener 112 via the opening (as described in embodiments in the sections below related to Designs 11-14).

Other features of BGA package 900 are similar to the corresponding features in aforementioned designs.

Design 10—Partially Depopulated Package with Partially Exposed Stiffener

Figure 10:
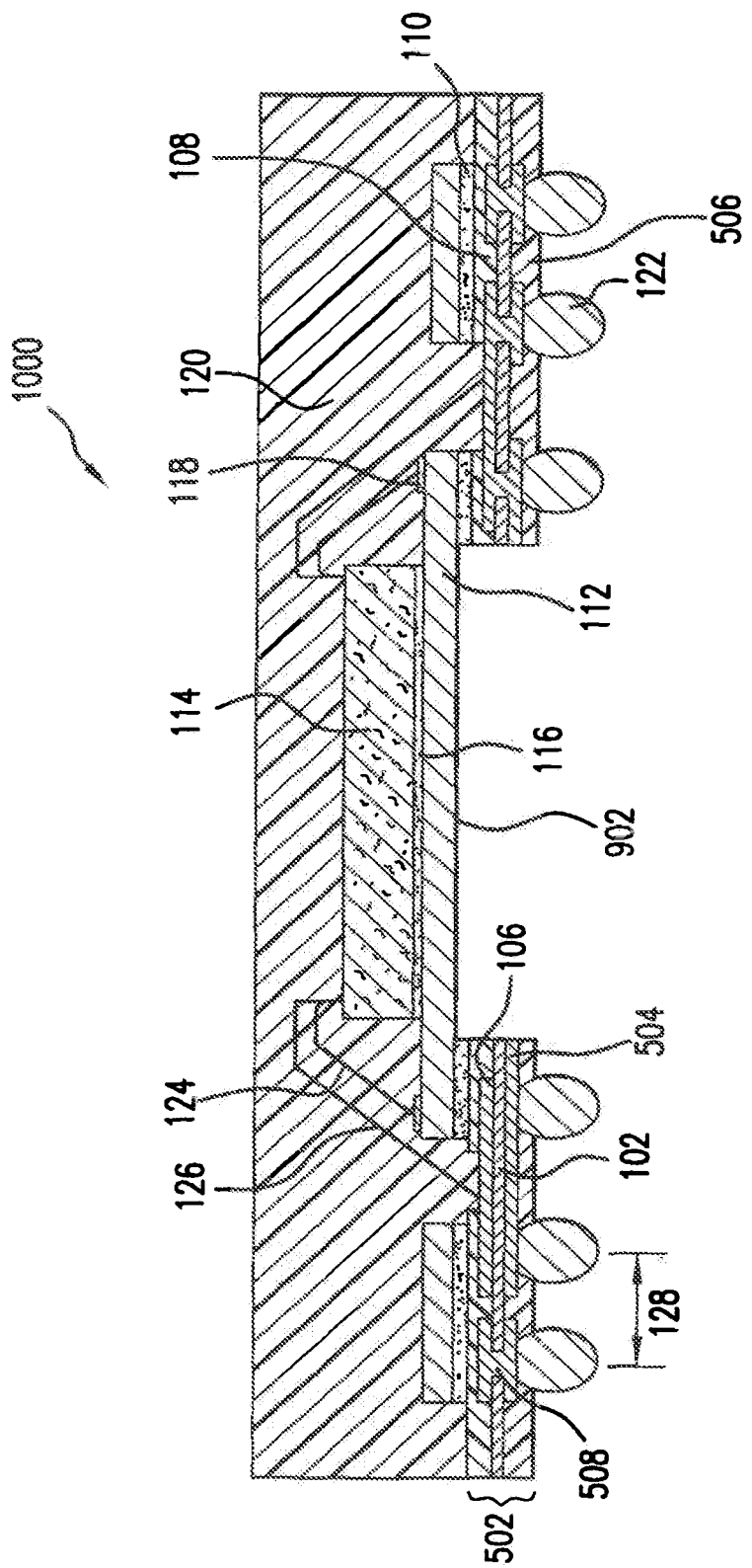
FIG. 10 is a cross-sectional representation of another BOA package design in accordance with one embodiment of the disclosed method and apparatus.

FIG. 10 shows a BGA package 1000, according to an embodiment of the present invention. As shown in FIG. 10, BGA package 1000 is similar to BGA package 900 shown in FIG. 9, except that BGA package includes substrate 502, which has two patterned conductive layers (first and second metal layers 106 and 504), instead of one metal layer, for enhanced routing flexibility. Substrate 502 has a punched opening or window, similar to that shown in substrate 130 in FIG. 9.

Other features of BGA package 1000 are similar to the corresponding features in aforementioned designs.

Design 11—Partially Depopulated Package with Drop-in Heat Slug

Figure 11:
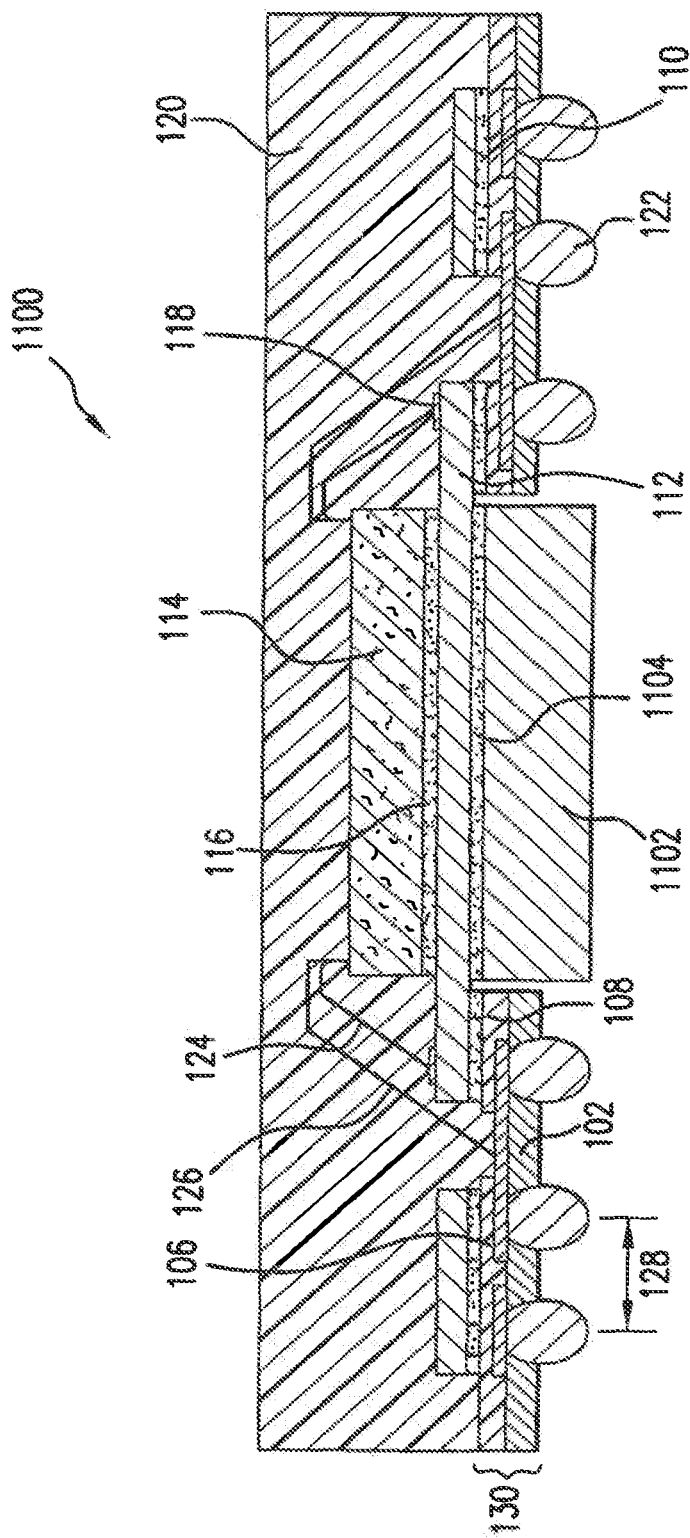
FIG. 11 is a cross-sectional representation of another BGA package design in accordance with one embodiment of the disclosed method and apparatus.

FIG. 11 shows a BGA package 1100, according to an embodiment of the present invention. As shown in FIG. 11, BGA package 1100 is similar to BGA package 900 shown in FIG. 9, but with an additional drop-in heat slug 1102 attached to the bottom surface of stiffener 112 by adhesive 1104. Adhesive 1104 is a conductive adhesive, epoxy, or solder. Heat slug 1102 allows direct conductive heat dissipation from die 114 through die attach epoxy 116, stiffener 112, adhesive 1104, and heat slug 1102 to an attached motherboard (not shown).

Other features of BGA package 1100 are similar to the corresponding features in aforementioned designs.

Design 12—Partially Depopulated Package with Drop-in Heat Slug

Figure 12:
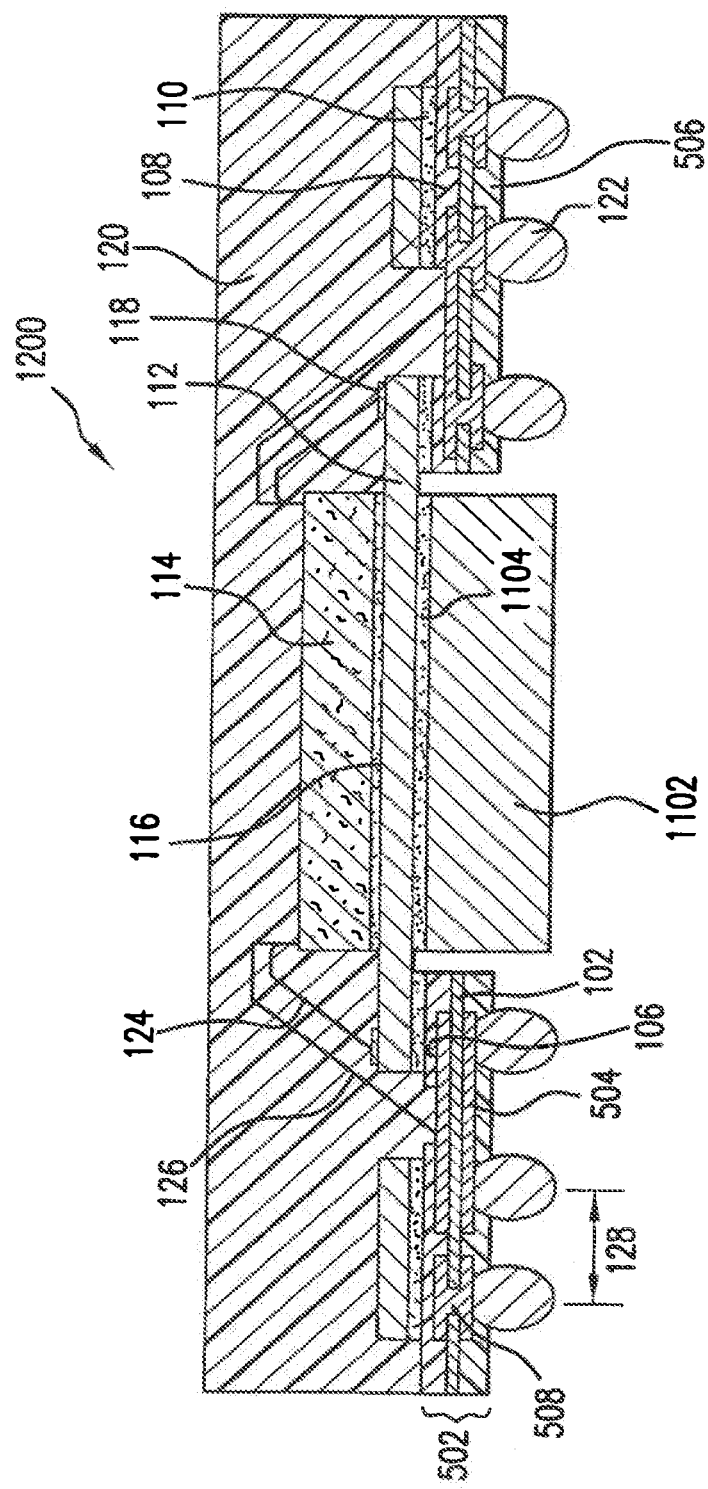
FIG. 12 is a cross-sectional representation of another BOA package design in accordance with one embodiment of the disclosed method and apparatus.

FIG. 12 shows a BGA package 1200, according to an embodiment of the present invention. As shown in FIG. 12, BGA package 1200 is similar to BGA package 1000 shown in FIG. 10, but with the addition of drop-in heat slug 1102. Heat slug 1102 allows direct conductive heat dissipation from the die 114 through die attach epoxy 116, stiffener 112, adhesive 1104, and heat slug 1102 to an attached motherboard (not shown).

Other features of BGA package 1200 are similar to the corresponding features in aforementioned designs.

Design 13—Partially Depopulated Package with Drop-in Heat Slug

Figure 13:
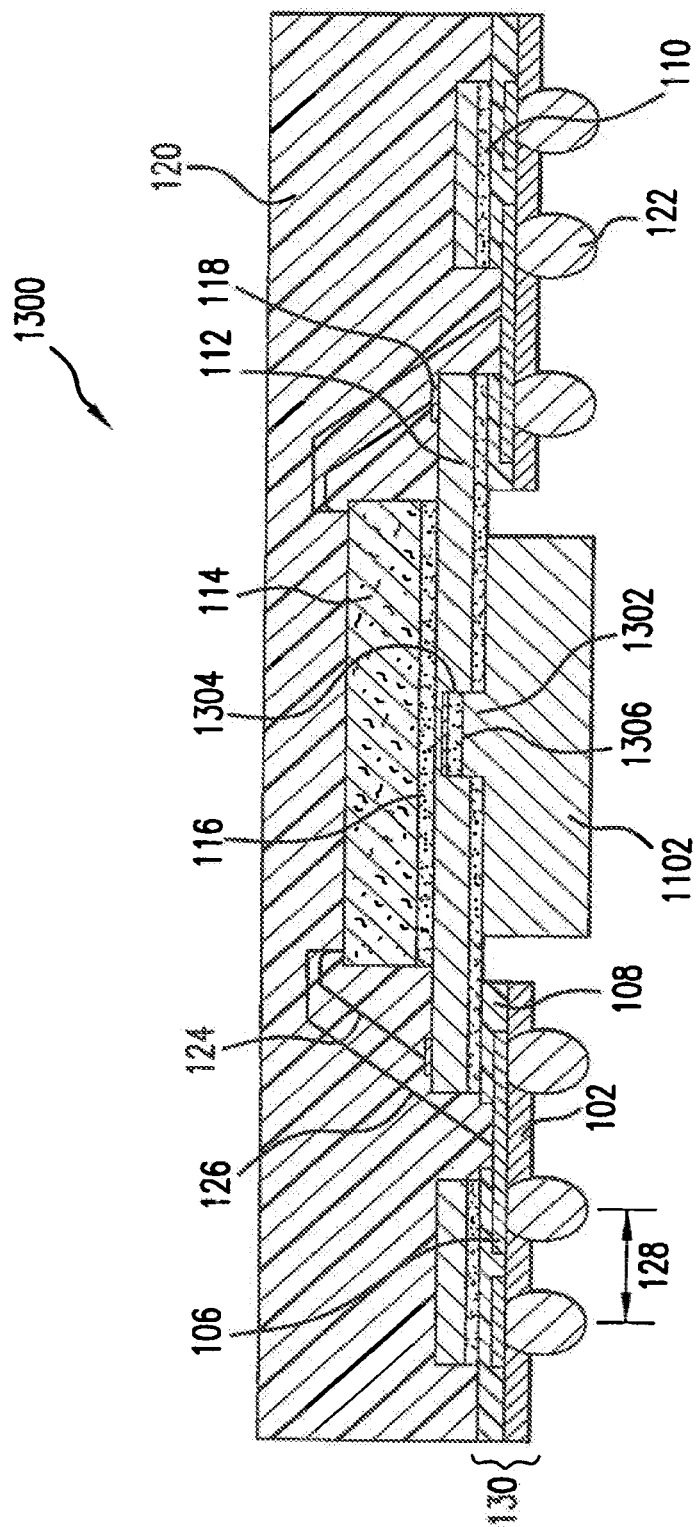
FIG. 13 is a cross-sectional representation of another BGA package design in accordance with one embodiment of the disclosed method and apparatus.

FIG. 13 shows a BGA package 1300, according to an embodiment of the present invention. As shown in FIG. 13, BGA package 1300 is similar to BGA package 1100 shown in FIG. 11. The difference is that BGA package 1300 has an added locking mechanism for attaching drop-in heat slug 1102 to stiffener 112. The locking mechanism includes a bump 1302 on heat slug 1102 that fits into a slot 1304 in stiffener 112. The locking mechanism allows easy attachment and alignment of heat slug 1102 to stiffener 112. An adhesive 1306 is used to adhere bump 1302 in slot 1304. Adhesive 1306 may be a conductive adhesive, epoxy, or solder.

Other features of BGA package 1300 are similar to the corresponding features in aforementioned designs.

Design 14—Partially Depopulated Package with Drop-in Heat Slug

Figure 14:
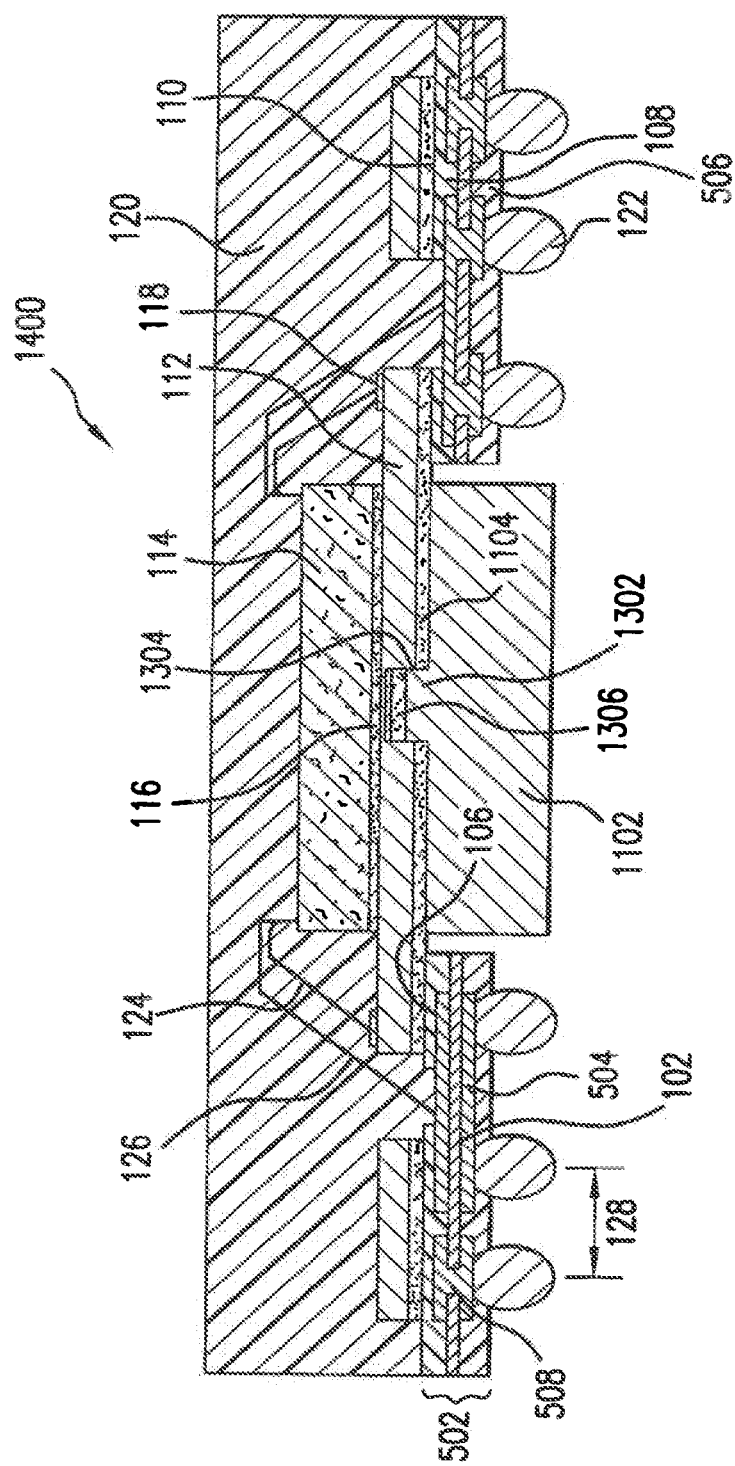
FIG. 14 is a cross-sectional representation of another BGA package design in accordance with one embodiment of the disclosed method and apparatus.

FIG. 14 shows a BGA package 1400, according to an embodiment of the present invention. As shown in FIG. 14, BGA package 1400 is similar to BGA package 1300 shown in FIG. 13, except it includes a substrate 502 that has two conductive layers (first and second metal layers 106 and 504) instead of a single conductive layer.

Other features of BGA package 1400 are similar to the corresponding features in aforementioned designs.

Figure 15:
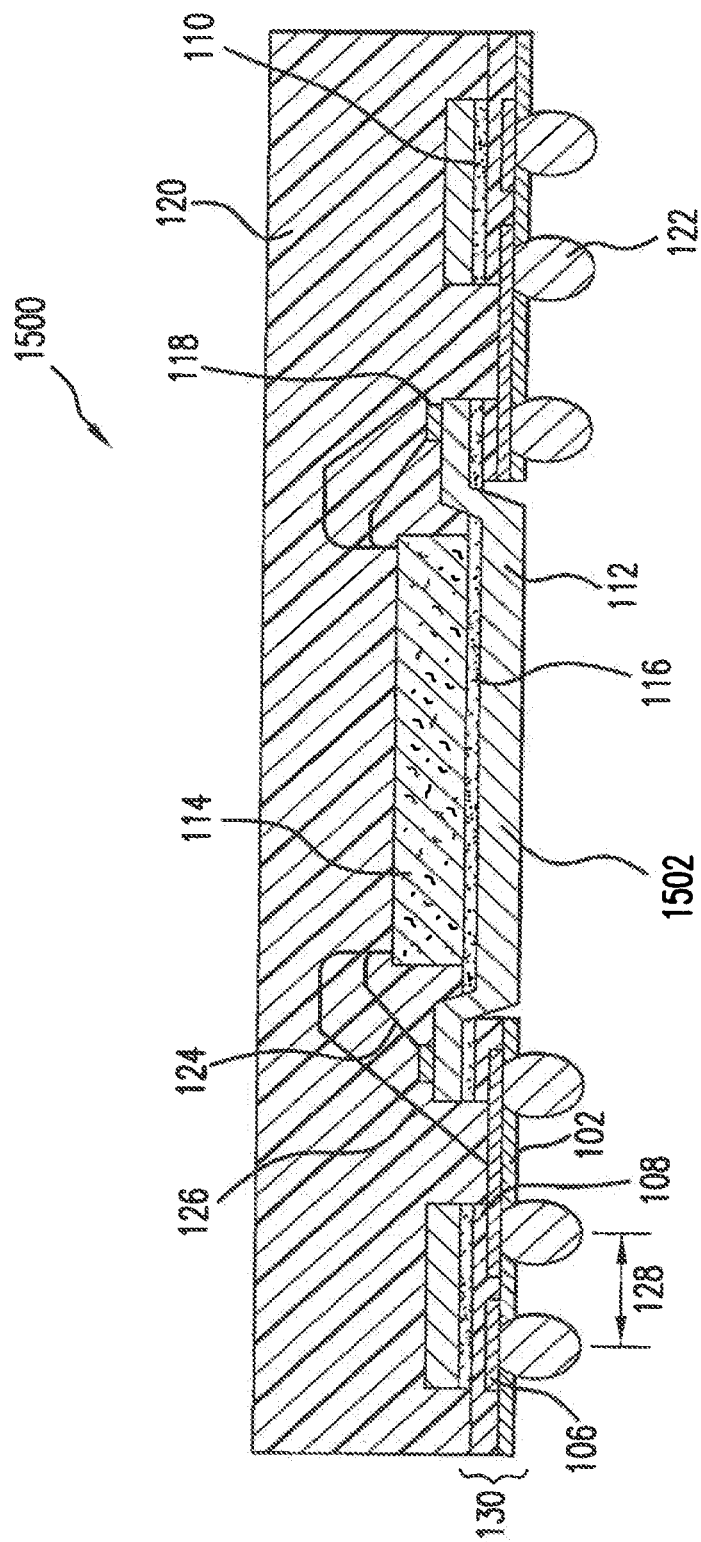
FIG. 15 is a cross-sectional representation of another BGA package design in accordance with one embodiment of the disclosed method and apparatus.

Design 15—Partially Depopulated Package with Partially Exposed Down-Set Stiffener FIG. 15 shows a BGA package 1500, according to an embodiment of the present invention. As shown in FIG. 15, BGA package 1500 has a stiffener 112 with a lowered and exposed stiffener portion 1502. This "down-set" stiffener portion 1502 provides for a thinner package design. For example, as shown in FIG. 15, die 114 can sit lower in BGA package 1500 than in other BGA packages. The exposed stiffener 112 also enhances thermal performance similar to BGA package 900 shown in FIG. 9.

Other features of BGA package 1500 are similar to the corresponding features in aforementioned designs.

Figure 16:
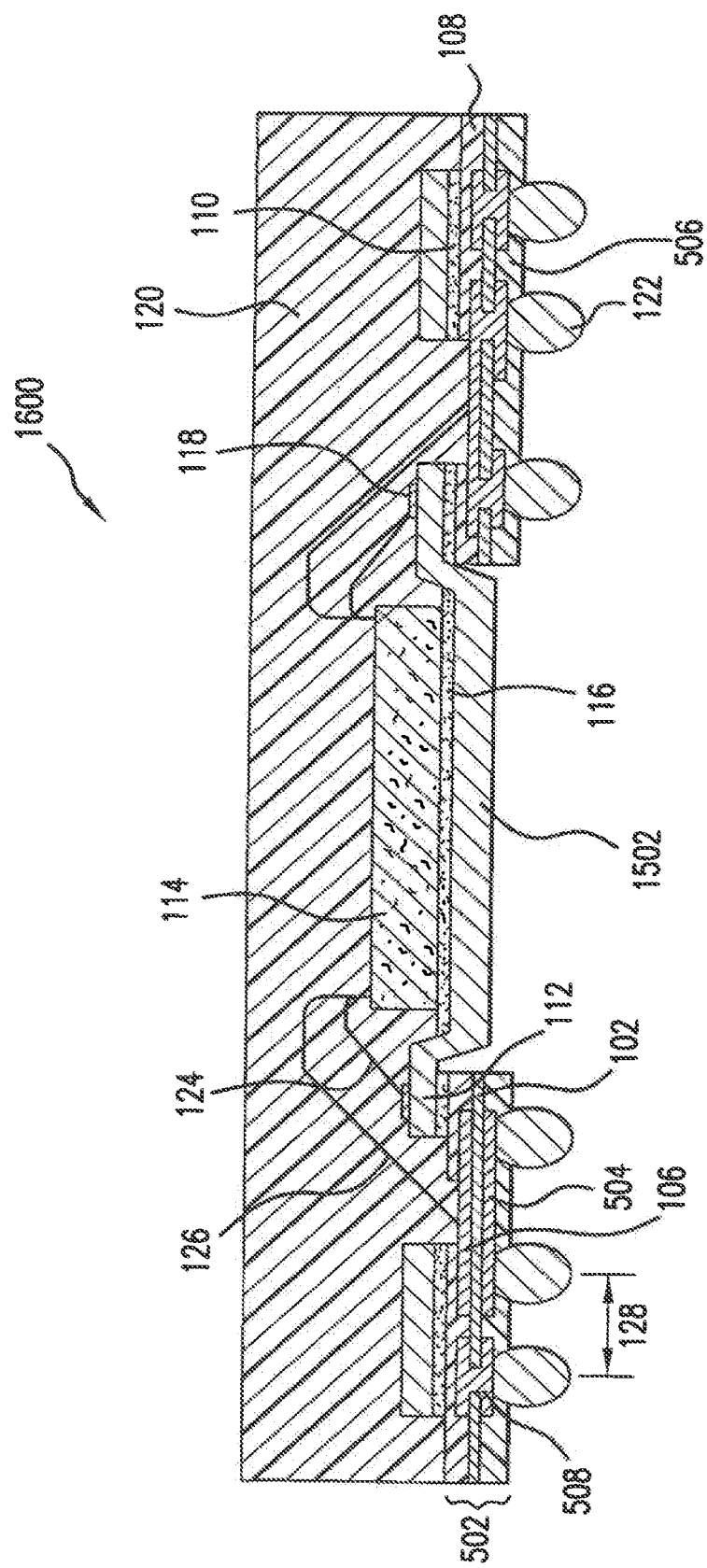
FIG. 16 is a cross-sectional representation of another BGA package design in accordance with one embodiment of the disclosed method and apparatus.

Design 16—Partially Depopulated Package with Partially Exposed Down-Set Stiffener FIG. 16 shows a BGA package 1600, according to an embodiment of the present invention. As shown in FIG. 16, BGA package 1600 is similar to BGA package 1500 shown in FIG. 15, except that substrate 502 in BGA package 1500 includes two conductive layers (first and second metal layers 106 and 504) instead of a single conductive layer.

Other features of BGA package 1600 are similar to the corresponding features in aforementioned designs.

Figure 17:
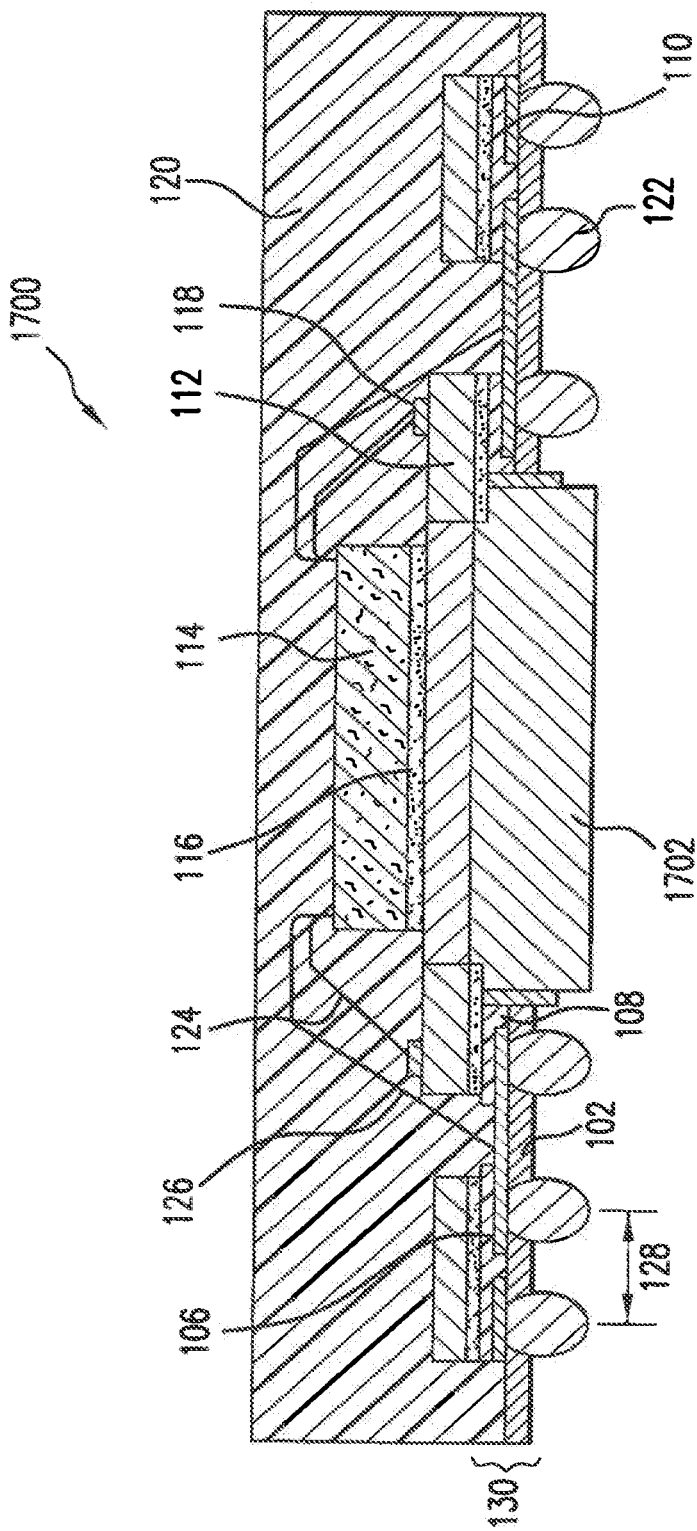
FIG. 17 is a cross-sectional representation of another BGA package design in accordance with one embodiment of the disclosed method and apparatus.

Design 17—Partially Depopulated Package with a One-Piece Stiffener/Die Paddle/Heat Slug FIG. 17 shows a BGA package 1700, according to an embodiment of the present invention. As shown in FIG. 17, BGA package 1700 incorporates a one-piece stiffener/die paddle/heat slug 1702 such that die 114 sits directly on top of stiffener/die paddle/heat slug 1702. BGA package 1700 provides excellent thermal performance, as heat directly dissipates from die 114 through die attach epoxy 116 and stiffener/die paddle/heat slug 1702 to an attached motherboard (not shown).

Other features of BGA package 1700 are similar to the corresponding features in aforementioned designs.

Figure 18:
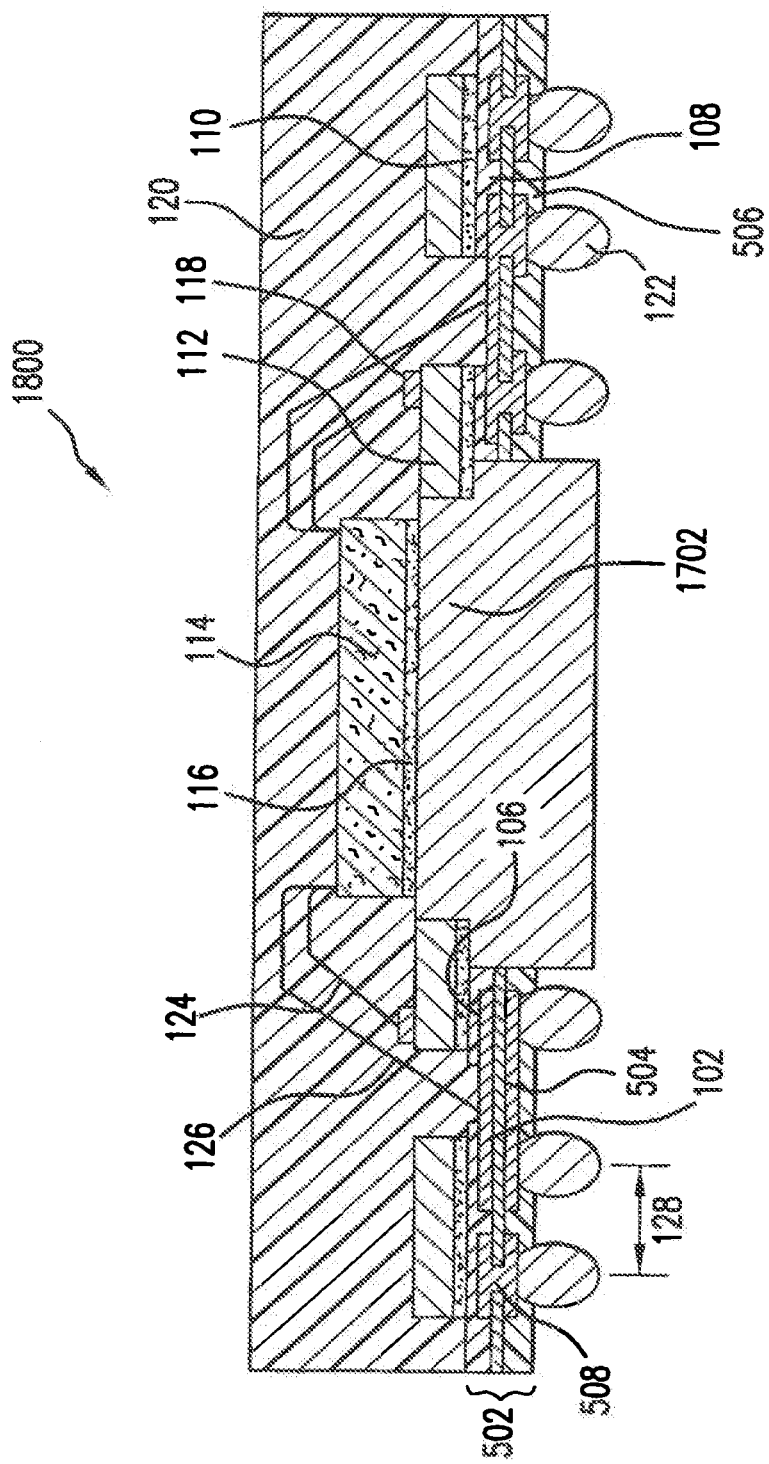
FIG. 18 is a cross-sectional representation of another BGA package design in accordance with one embodiment of the disclosed method and apparatus.

Design 18—Partially Depopulated Package with a One-Piece Stiffener/Die Paddle/Heat Slug FIG. 18 shows a BGA package 1800, according to an embodiment of the present invention. As shown in FIG. 18, BGA package 1800 is similar to BGA package 1700 shown in FIG. 17, except that substrate 502 of BGA package 1800 includes two conductive layers (first and second metal layers 106 and 504) instead of a single conductive layer.

Other features of BGA package 1800 are similar to the corresponding features in aforementioned designs.

Note that all of the above designs may be manufactured in wafer saw format for maximized material utilization.

Refer to Table 2 below, which provides a brief overview of the above described embodiments/designs.

TABLE 2

| Design | Description | Advantages |
|---|---|---|
| 1 | 1 ML substrate + thick stiffener with selective plating | Fully populated thermally enhanced package (Use Adhesive Base Polyimide) Ground bond on heat spreader |
| 2 | 1 ML substrate + thick stiffener with selective plating | Fully populated thermally enhanced package (Use Adhesiveless Base Polyimide) |
| 3, 4 | Two pieces stiffener with selective plating | To achieve split ground function (analog & digital ground) with dielectric adhesive material |
| 5 | 2 ML substrate + thick stiffener with selective plating | To improve routability, electrical and thermal performance |
| 6 | 4 ML substrate + thick stiffener with selective plating | Excellent routability, electrical and thermal performance |
| 7 | 1 ML substrate + thick stiffener with selective plating + active ground ball connect to heat spreader | To improve signal integrity for noise reduction by grounding the discharge current through the ground bond, stiffener and discharge to the mother board |
| 8 | 2 ML substrate + thick stiffener with selective plating + active ground ball connect to heat spreader | To improve routability, electrical and thermal performance To improve signal integrity for noise reduction by grounding the discharge current through the ground bond, stiffener and discharge to the mother board |
| 9 | 1 ML substrate + thick stiffener with selective plating + window opening | To improve the thermal performance by exposing the die paddle through window punched opening To improve plating traces routability through debussing window punched opening |
| 10 | 2 ML substrate + thick stiffener with selective plating + window opening | To improve routability, electrical and thermal performance To improve the thermal performance by exposing the die paddle through window punched opening To improve plating traces routability through debussing window punched opening |
| 11 | 1 ML substrate + thick stiffener with selective plating + window opening + drop-in heat slug | Excellent thermal performance. Direct conductive heat dissipation from silicon thru epoxy, stiffener, heat slug to mother board To improve plating traces routability through debussing window punched opening |
| 12 | 2 ML substrate + thick stiffener with selective plating + window opening + drop-in heat slug | Excellent thermal performance. Direct conductive heat dissipation from silicon thru epoxy, stiffener, heat slug to mother board To improve plating traces routability through debussing window punched opening To improve routability, electrical and thermal peformance |
| 13 | 1 ML substrate + thick stiffener with selective plating + window opening + drop-in heat slug with mechanical locking mechanism | Excellent thermal performance. Direct conductive heat dissipation from silicon thru epoxy, stiffener, heat slug to mother board To improve plating traces routability through debussing window punched opening To improve heat slug adhesion by increasing the contact surface area |
| 14 | 2 ML substrate + thick stiffener with selective plating + window opening + drop-in heat slug with mechanical locking mechanism | Excellent thermal performance. Direct conductive heat dissipation from silicon thru epoxy, stiffener, heat slug to mother board To improve plating traces routability through debussing window punched opening To improve routability, electrical and thermal peformance To improve heat slug adhesion by increasing the contact surface area |
| 15 | 1 ML substrate + thick stiffener with selective | To improve the thermal performance by exposing the die paddle through |

TABLE 2-continued

| Design | Description | Advantages |
|---|---|---|
| | plating + down set paddle + window opening | window punched opening<br>To improve plating traces routability through debussing window punched opening<br>Lower package thickness profile by applying down-set die paddle construction |
| 16 | 2 ML substrate + thick stiffener with selective plating + down set paddle + window opening | To improve the thermal performance by exposing the die paddle through window punched opening<br>To improve plating traces routability through debussing window punched opening<br>Lower package thickness profile by applying down-set die paddle construction<br>To improve routability, electrical and thermal performance |
| 17 | 1 ML substrate + thick stiffener with selective plating + stiffener window opening + tape opening + die paddle heat slug | Excellent thermal performance. Direct conductive heat dissipation from silicon thru epoxy, stiffener, heat slug to mother board<br>To improve plating traces routability through debussing window punched opening<br>One-piece stiffener, die paddle and heat slug concept |
| 18 | 2 ML substrate + thick stiffener with selective plating + stiffener window opening + tape opening + die paddle heat slug | Excellent thermal performance. Direct conductive heat dissipation from silicon thru epoxy, stiffener, heat slug to mother board<br>To improve plating traces routability through debussing window punched opening<br>One-piece stiffener, die paddle and heat slug concept<br>To improve routability, electrical and thermal performance |

CONCLUSION

Although the invention herein has been described with reference to particular embodiments, it is to be understood that the embodiments are merely illustrative of the principles and application of the present invention. It is therefore to be understood that various modifications may be made to the above mentioned embodiments and that other arrangements may be devised without departing from the spirit and scope of the present invention. For example, Design 5 could be modified to incorporate two stiffeners to achieve split grounding. In fact any of the above mentioned designs may be combined with any other design or designs to produce a new package.

What is claimed is:

1. A ball grid array package, comprising:
   a substrate having opposing first and second surfaces, wherein the substrate has a window opening through the substrate that is open at the first surface of the substrate and the second surface of the substrate;
   a stiffener having first and second surfaces, wherein the first surface of the stiffener is coupled to the first surface of the substrate;
   a trace formed on the first surface of the substrate, at least a portion of a footprint of the trace being located within at least a portion of a footprint of the stiffener;
   an IC die coupled to the second surface of the stiffener; and
   a heat slug coupled through the window opening in the substrate to the first surface of the stiffener, wherein the heat slug protrudes through the window opening in the substrate and is configured to contact a printed circuit board (PCB).

2. The package of claim 1, further comprising:
   a plurality of solder balls coupled to the second surface of the substrate.

3. The package of claim 1, wherein the substrate comprises a plurality of metal layers.

4. The package of claim 1, further comprising:
   a first wire bond coupled between a contact pad formed on the IC die and the second surface of the stiffener; and
   a second wire bond coupled between a second contact pad formed on the IC die and the first surface of the substrate.

5. The package of claim 1, wherein the heat slug comprises a bump that is configured to fit into a slot formed in the first surface of the stiffener.

6. A ball grid array package, comprising:
   a substrate having opposing first and second surfaces, wherein the substrate has a window opening through the substrate that is open at the first surface of the substrate and the second surface of the substrate and wherein the substrate comprises a metal layer;
   a stiffener having first and second surfaces, wherein the first surface of the stiffener is coupled to the first surface of the substrate;
   an IC die coupled to the second surface of the stiffener;
   a heat slug coupled through the window opening in the substrate to the first surface of the stiffener;
   a plurality of solder balls coupled to the second surface of the substrate;
   a first wire bond coupled between a contact pad formed on the IC die and the second surface of the stiffener; and
   a second wire bond coupled between a second contact pad formed on the IC die and the first surface of the substrate, wherein the second wire bond passes through an opening formed in the stiffener.

7. A ball grid array package, comprising:
   a substrate having opposing first and second surfaces, wherein the substrate has a window opening through the substrate that is open at the first surface of the substrate and the second surface of the substrate and wherein the substrate comprises a metal layer;
   a stiffener having first and second surfaces, wherein the first surface of the stiffener is coupled to the first surface of the substrate;
   an IC die coupled to the second surface of the stiffener; and
   a heat slug coupled through the window opening in the substrate to the first surface of the stiffener, wherein the stiffener includes at least one opening formed therein.

8. The package of claim 1, further comprising an encapsulate that encapsulates the IC die.

9. The package of claim 1, wherein the package is configured to be attached to the PCB and wherein the heat slug is configured to directly dissipate heat from the IC die to the PCB.

10. The package of claim 1, wherein the PCB is a motherboard.

11. A ball grid array package, comprising:
    a substrate having opposing first and second surfaces, wherein the substrate has a window opening through the substrate that is open at the first surface of the substrate and the second surface of the substrate and wherein the substrate comprises a metal layer;
    a stiffener having first and second surfaces, wherein the first surface of the stiffener is coupled to the first surface of the substrate;
    an IC die coupled to the second surface of the stiffener, and
    a heat slug coupled through the window opening in the substrate to the first surface of the stiffener, wherein the substrate further comprises:

a circuit mask located between the metal layer and the first surface of the substrate.

12. The package of claim 11, wherein the substrate further comprises:
a dielectric material located between the metal layer and the second surface of the substrate.

13. The package of claim 1, wherein the stiffener comprises a metal.

14. A ball grid array package, comprising:
a substrate having opposing first and second surfaces, wherein the substrate has a window opening through the substrate that is open at the first surface of the substrate and the second surface of the substrate;
a stiffener having first and second surfaces and including an opening that exposes at least a portion of the substrate, wherein the first surface of the stiffener is coupled to the first surface of the substrate; and
an IC die coupled to the second surface of the stiffener and wherein the stiffener is configured to dissipate heat generated by the IC die.

15. The package of claim 14, wherein the substrate comprises a metal layer and wherein the opening exposes a portion of the metal layer.

16. The package of claim 14, further comprising:
a wire bond attached to the IC die and to the metal layer, wherein the wirebond passes through the opening.

17. The package of claim 16, further comprising:
a second wire bond attached to the IC die and the second surface of the stiffener.

18. The package of claim 14, further comprising:
a wire bond attached to the IC die and the second surface of the stiffener.

19. The package of claim 14, wherein the stiffener comprises a metal.

20. The package of claim 14, wherein the substrate comprises a plurality of metal layers.

* * * * *

UNITED STATES PATENT AND TRADEMARK OFFICE
CERTIFICATE OF CORRECTION

PATENT NO. : 8,686,558 B2  
APPLICATION NO. : 13/224933  
DATED : April 1, 2014  
INVENTOR(S) : Zhao et al.

Page 1 of 1

It is certified that error appears in the above-identified patent and that said Letters Patent is hereby corrected as shown below:

In the Claims

Column 12, line 6, please replace "wirebond" with --wire bond--.

Signed and Sealed this
Twenty-third Day of September, 2014

Michelle K. Lee
*Deputy Director of the United States Patent and Trademark Office*